United States Patent [19]

Ishiwata et al.

[11] Patent Number: 5,300,172
[45] Date of Patent: Apr. 5, 1994

[54] SURFACE-PROTECTION METHOD DURING ETCHING

[75] Inventors: Shinichi Ishiwata; Kazushige Iwamoto, both of Hiratsuka; Michio Ueyama, Yokohama; Isamu Noguchi, Tokyo, all of Japan

[73] Assignee: The Furukawa Electric Co., Ltd., Tokyo, Japan

[21] Appl. No.: 968,353

[22] Filed: Oct. 29, 1992

[30] Foreign Application Priority Data

Nov. 1, 1991 [JP] Japan .................................. 3-313075

[51] Int. Cl.$^5$ ............................................. B32B 31/00
[52] U.S. Cl. .............................. 156/275.5; 156/275.7; 156/289; 156/247; 156/332; 156/631; 156/662; 156/307.7
[58] Field of Search .................. 156/275.5, 275.7, 289, 156/247, 332, 631, 662, 273.9, 281, 307.7

[56] References Cited

U.S. PATENT DOCUMENTS

| | | | |
|---|---|---|---|
| 3,953,919 | 5/1976 | Moore | 29/583 |
| 3,960,623 | 6/1976 | Gantley | 156/631 |
| 4,720,317 | 1/1988 | Kuroda et al. | 156/275.5 |
| 5,098,501 | 3/1992 | Nishiguchi | 156/275.5 |
| 5,110,388 | 5/1992 | Komiyama et al. | 156/275.5 |

*Primary Examiner*—David A. Simmons
*Assistant Examiner*—Chester T. Barry
*Attorney, Agent, or Firm*—Birch, Stewart, Kolasch & Birch

[57] ABSTRACT

There is disclosed a surface-protection method during chemical etching of a plate material, which comprises sticking a radiation-curable adhesive tape onto the area of plate material where etching should not be effected, and after the radiation-curable adhesive layer is cured with irradiation of radiation, subjecting said plate material to a chemical etching treatment.

9 Claims, No Drawings

SURFACE-PROTECTION METHOD DURING ETCHING

FIELD OF THE INVENTION

The present invention relates to a method for protecting a surface that should not be etched when a plate material is etched, and more particularly to a method for protecting a surface on which patterns are formed when the back surface of a pattern formed wafer in the step of producing various semiconductors is chemically etched for various applications, or for protecting an area that should not be etched when etching various metal materials.

BACKGROUND OF THE INVENTION

As wafers for use in the production of semiconductors, for example, silicon wafers and gallium/arsenic wafers are generally known, and silicon wafers are used in many cases. A silicon wafer is produced by cutting a highly pure silicon ingot, obtained by the single crystal pulling method, into slices of thickness on the order of 500 to 1,000 μm. Processing the thus produced wafer in various ways, a number of patterns of integrated circuits are formed on the wafer. Then, depending on the use of wafer, the back surface of the circuit-patterned wafer is ground by an apparatus called a backside grinder or is chemically etched (hereinafter referred to as "is etched"), in order to make the wafer thinner.

The step of grinding the back surface of a semiconductor wafer is carried out in such a way that the circuit-pattern formed wafer surface is secured by suction and the back surface is ground so that the thickness is reduced, for example from 500 μm to 300–200 μm, and is made uniform. Thereafter, in order to remove processstrains caused, for example, by heat during the grinding, or in order to make the wafer thinner, an etching treatment is carried out, for example by dipping the wafer in an etching liquid.

Accordingly, when the back surface of a wafer is processed, it is necessary to coat the pattern formed surface with a resist ink or the like, which is excellent in etching resistance, in order to protect the patterns. However, to remove the resist ink after the etching, washing with an organic solvent is necessary. Hence there is the problem of pollution of the working environment or restriction of solvents, which problem remains to be solved. Therefore, a novel surface protection method that does not necessitate a resist ink is desired.

On the other hand, in order to protect a wafer surface when the wafer is etched, attempts are made to use a low-adhesive surface-protective tape, but such surface-protective tapes are poor in etching resistance and are also detached from the adherend during the etching treatment, often resulting in a problem of corrosion of the patterns on the wafer. Although attempts are made to increase the adhesive force of tape to prevent the tape from detaching, there arises the problem that not only the etching resistance property is still not satisfactory, but also the wafer is damaged when the tape is separated from the adherend wafer after the etching because the adhesive force is too strong.

To solve these problems, a radiation-curable adhesive tape was developed. The adhesive tape is made up of a support through which rays, such as ultraviolet rays, or ionizing radiation, such as an electron beam, can pass and that has etching resistance, and an adhesive layer that is curable by irradiation coated on the support. The adhesive force of tape before curing with radiation is made high so that the tape stuck onto the adherend can lessen penetration of an etching liquid when the etching is effected; the tape itself is resistant to etching, and the peeling of the tape from the adherend is made easy by lowering the adhesive force of tape by irradiating it with radiation after the etching.

However, since the adhesive of the radiation-curable adhesive tape is itself poor in etching resistance, the area where the adhesive itself is exposed to the etching liquid is attacked by the etching liquid, which causes glue to remain on the adherend (wafer). Although the remaining glue itself is present usually only at the circumferential area of the wafer and does not reach the pattern formed area, since the glue contains etching liquid, its corrosive gas volatilizes, due to such as heat at the time of irradiation with radiation, causing the problem which may adversely affect aluminum terminals.

Further, in some cases the radiation-curable adhesive tape itself is heated by the heat generated with etching and as a result the adhesive force increases after the curing with radiation. Thus, when the adhesive force at the time of peeling increases, a problem arises that, for example, the peeling of the tape fails, or glue remains on the patterned surface, or the wafer is apt to be damaged by the stress exerted when the tape is peeled.

SUMMARY OF THE INVENTION

The object of the present invention is to provide a surface-protection method that prevents an adhesive exposed at the circumferential part of a wafer from remaining as a glue after corrosion and prevents deterioration by absorption of an etching liquid, and that prevents glue on a patterned surface from remaining or prevents tape from failure of peeling caused by a change in adhesive force of a radiation-curable adhesive due to heat generated at the time of etching.

Other and further objects, features, and advantages of the invention will appear more fully from the following description.

DETAILED DESCRIPTION OF THE INVENTION

The present inventors have studied in various ways to overcome these defects of the conventional surface-protection method through the use of a radiation-curable adhesive tape at the time of etching, and as a result they have found that when a tape is stuck onto an adherend wafer, and then the radiation-curable adhesive layer is cured with irradiation of a radiation to form a three-dimensional network, before the etching treatment, etching resistance can be much enhanced, for example, by improving acid resistance to the etching liquid, and by lowering the water absorption, leading to completion of the present invention.

That is, the present invention provides a surface-protection method when a plate material is chemically etched, which comprises sticking a radiation-curable adhesive tape onto an area of the plate material where etching should not be effected, and after the radiation-curable adhesive layer is cured with irradiation of a radiation, subjecting said plate material to an etching treatment.

In this specification and the claims, the term "adhesive tape" means a pressure-sensitive adhesive tape, and the term "adhesive" means a pressure-sensitive adhesive.

The radiation-curable adhesive tape to be used in the surface-protection method of the present invention comprises a radiation-curable adhesive applied onto a film support made of a material that is resistant to chemical etching and capable of transmitting radiation. Etching liquids for chemical etching include chemical etching liquids containing at least one compound selected from the group consisting of hydrogen fluoride, hydrogen chloride, sulfuric acid, nitric acid, acetic acid, hydrogen peroxide, and phosphoric acid, though this invention is not limited to them.

As the film support, a film support made, for example, of a low-density polyethylene, a straight-chain low-density polyethylene, an intermediate-density polyethylene, a high-density polyethylene, an isotactic polypropylene, and a homopolymer of an $\alpha$-olefin, such as a poly(4-methylpentene-1); or a fluororesin, such as ethylene tetrafluoride (polytetrafluoroethylene), FEP (copolymer of tetrafluoroethylene and hexafluoropropylene), or PFA (copolymer of tetrafluoroethylene and perfluoroalkyl vinyl ether); or a polyester resin, such as a polyethylene terephthalate; is preferably used.

Of these resins, more preferably a high-density polyethylene, an isotactic polypropylene, and a polyethylene terephthalate are preferably used.

The film support may have, on the resin layer that is resistant to etching, another resin layer in order to satisfy functions required for the film support, i.e., (1) a function that imparts, to the tape itself, cushioning properties that mitigate and absorb external force that will be exerted on the adherend during grinding of the semiconductor wafer, in order to prevent the wafer itself from being damaged, for example from being microcracked, and (2) a function that imparts, to the tape itself, flexibility that enables the tape to adhere favorably onto a pattern formed surface of a wafer that has complicated recesses, so that the tape can be firmly secured without swelling or separation. However, in this case it is necessary to select a combination of resins so that the etching resistance properties of the film support are not impaired.

As the resin that will be laid on the resin that has etching resistance properties can be mentioned, for example, an ethylene/vinyl chloride copolymer, a polybutene-1, a 1,2-polybutadiene, a polyurethane, an ethylene/ethyl acrylate copolymer, an ethylene/methyl acrylate copolymer, an ethylene/acrylic acid copolymer, and a homopolymer or a copolymer of an $\alpha$-olefin, such as an ionomer; or a mixture of these, which can be chosen arbitrarily depending on the properties required for the film support.

To produce the film support, although a conventionally known extrusion process can be used, in the case of a film support obtained by laminating various resins, the co-extrusion method or the lamination method is used, wherein a bonding layer may be placed between the resins as is practiced in the production of a usual laminated film.

Generally, the thickness of such a film support is suitably 30 to 300 $\mu$m in view of the strength and extension properties and the transmission of radiation.

There is no particular restriction on the radiation-curable adhesive to be provided on the film support, as long as the radiation-curable adhesive exhibits the desired curability with radiation. An example is a composition containing 100 parts by weight of an acrylic adhesive and 5 to 200 parts by weight of a compound selected from a group consisting of isocyanurate compounds and cyanurate compounds that have carbon-carbon double bonds, with which a photoinitiator and a polymerization promoter, as well as a tackifier, a softening agent, an antioxidant, a pigment, etc., have been blended.

Further, a polyester- or polyol-type urethane acrylate compound having two or more carbon-carbon double bonds may be added to the above compound so that the adhesive after the irradiation with radiation is rendered flexible.

The acrylic adhesive for use in the present invention is a homopolymer whose major constitutional unit is acrylic acid or methacrylic acid, or a copolymer of acrylic acid, or methacrylic acid, or its ester, or its acid amide, or the like with other copolymerizable comonomer, or a mixture of such copolymers. The monomer and the comonomer include, for example, alkyl acrylates or alkyl methacrylates, such as methyl acrylate, methyl methacrylate, ethyl acrylate, ethyl methacrylate, butyl acrylate, butyl methacrylate, 2-ethylhexyl acrylate, 2-ethylhexyl methacrylate, octyl acrylate, octyl methacrylate, glycidyl acrylate, glycidyl methacrylate, hydroxymethyl acrylate, hydroxymethyl methacrylate, 2-hydroxyethyl acrylate, 2-hydroxyethyl methacrylate, hydroxypropyl acrylate, and hydroxypropyl methacrylate, acrylic acid amides or methacrylic acid amides; and acrylic acid N-substituted amides or methacrylic acid N-substituted amides, such as N-hydroxymethyl acrylamide or N-hydroxymethyl methacrylamide. If necessary, a crosslinking agent, such as a polyisocyanate compound or an alkyl etherified melamine compound, can be blended additionally.

Further, the cyanurate or isocyanurate compound is a compound having a triazine ring or an isotriazine ring and at least two radiation-polymerizable carbon-carbon double bonds in the molecule, and it may be a monomer or an oligomer or a mixture of them. The compound having a triazine ring or an isotriazine ring can generally be synthesized by common cyclizing reactions using, as a raw material, a halocyan compound, a dianiline compound, a diisocyanate compound, or the like. Further, radiation-polymerizable carbon-carbon double bond-containing groups, such as functional groups containing a vinyl group, an acryloxy group, or a methacryloxy group, are introduced into the thus synthesized compound to obtain a compound for use in the present invention.

In the present invention, although there is no particular restriction on the cyanurate compound or isocyanurate compound except the above points, desirably the carbon-carbon double bond-containing groups introduced to the triazine ring or isotriazine ring do not contain a so-called rigid molecular structure, such as an aromatic heterocyclic group. This is because if the radiation-polymerizable compound is made too rigid, the adhesive of the present invention becomes too brittle when cured with radiation. Therefore, preferably the linking group between the carbon-carbon double bond and the triazine ring or isotriazine ring is a group that allows free rotation of the atom. Examples of such a group include aliphatic groups, such as an alkylene group and an alkylidene group, which may have an —O— bond, an —OCO— bond, a —COO— bond, an —NHCO— bond, an —NHCOO— bond, or the like. If the linking groups are linked to the triazine ring through —O— bonds, at least one of three alkylene groups, the alkylidene group, or the like that is linked to the —O— bonds has two or more carbon atoms.

Specific examples of the cyanurate compound and isocyanurate compound include 2-propenyl-di-3-butenyl cyanurate, 2-hydroxyethylbis(2-acryloxyethyl) cyanurate, tris(acryloxyethyl) isocyanurate, tris(methacryloxyethyl) isocyanurate, bis(2-acryloxyethyl)-2-(5-acryloxy)hexyl-oxyethyl isocyanurate, tris(1,3-diacryloxyisopropyloxycarbonyl-n-hexyl) isocyanurate, and tris(1-acryloxy-3-methacryloxyisopropyl-oxycarbonylamino-n-hexyl) isocyanurate.

Preferably the number of radiation-polymerizable carbon-carbon double bonds per monomer of the above cyanurate compound or isocyanurate compound or per repeating unit of the oligomer of the above cyanurate compound or isocyanurate compound is generally at least 2, more preferably 2 to 6. If the number of double bonds is less than 2, a satisfactory degree of crosslinking is not obtained, which lowers the adhesive strength caused by irradiation, whereas if the number is more than 6, the adhesive agent after the curing with radiation becomes too brittle in some cases.

The amount of the cyanurate compound or isocyanurate compound to be blended into the radiation-curable adhesive of the present invention is generally 5 to 200 parts by weight for 100 parts by weight of the above acrylic adhesive. If the amount to be blended is too small, in some cases the curing (formation of a three-dimensional network) of the radiation-curable adhesive with irradiation becomes unsatisfactory, and denaturation or the like of the radiation-curable adhesive due to penetration of the etching liquid is liable to occur. On the other hand, if the amount to be blended is excessive, the adhesive force after the curing with radiation becomes too low, and loosening or separation of the tape during etching is liable to occur.

The urethane acrylate compound that can be added to the above compound in order to add flexibility to the physical properties of the adhesive after irradiation is a compound that has two or more radiation-curable carbon-carbon double bonds and that allows the physical properties after the curing with radiation to have elastic properties; it is, for example, a polyester or polyol urethane acrylate compound that has a straight-chain aliphatic structure and a urethane bond in the molecule, which may be a monomer or an oligomer.

Such compounds can be synthesized by using, as raw materials, for example, methacrylic acid, 2-hydroxyethyl acrylate, 2-hydroxyethyl methacrylate, 2-hydroxypropyl acrylate, 2-hydroxypropyl methacrylate, dimethylaminoethyl acrylate, dimethylaminoethyl methacrylate, diethylaminoethyl acrylate, diethylaminoethyl methacrylate, or polyethyleneglycol acrylate, and, for example, 2,4-tolylene diisocyanate, 2,6-tolylene diisocyanate, 1,3-xylylene diisocyanate, 1,4-xylene diisocyanate, or diphenylmethane-4,4'-diisocyanate.

When the radiation-curable adhesive of the present invention is cured with irradiation with ultraviolet rays, a photopolymerization initiator, such as isopropyl benzoin ether, isobutyl benzoin ether, benzophenone, Michler's ketone, chlorothioxathone, dodecylthioxathone, dimethylthioxanethone, diethylthioxanethone, benzyl dimethyl ketal, α-hydroxycyclohexyl phenyl ketone, and 2-hydroxymethylphenylpropane, can be additionally used. Adding one or more of these to the adhesive layer enables the cure reaction to proceed efficiently, which lowers the adhesive strength securing the adherend even if the cure reaction time is short or the amount of irradiation with ultraviolet rays is small.

In order to make the adhesion to the patterned surface favorable, suitably the thickness of the radiation-curable adhesive layer put on the film support is generally 10 to 50 μm.

Herein the term "radiation" refers to light, such as ultraviolet rays, and ionizing radiation, such as an electron beam.

In the present invention, the above radiation-curable adhesive tape is stuck onto the protective surface of the material that will be subjected to an etching treatment. Then, the adhesive tape stuck onto the protective surface is irradiated with radiation for a prescribed period, to cure the adhesive layer, thereby lowering the adhesive force of adhesive layer. Herein the term "cure" means that curing is sufficient to impart etching resistance (acid resistance and water resistance) to the adhesive layer. This curing treatment can be arbitrarily adjusted by appropriately setting the time of irradiation. By this curing treatment, the adhesive layer forms a three-dimensional network and the adhesive force of the adhesive layer itself decreases. That is, the adhesive force at this time is sufficient to prevent the tape from separating from the adherend during the etching. Therefore, the extent of the cure can be set by using the adhesive force as an index. For example, using, as an adherend of a radiation-curable adhesive tape, a stainless steel plate abraded with water resistant abrasive paper No. 280, the adhesive force after curing with radiation that is measured based on JIS Z0237 is preferably 20 g/25 mm or over, more preferably 20 to 200 g/25 mm, most preferably 20 to 100 g/25 mm. If the adhesive force is too small, the tape will detach from the adherend during the etching, and satisfactory etching resistance performance is not always exhibited depending on the type of etching liquid or the treatment time. When the adhesive force is 200 g/25 mm or less, the resistance to the etching liquid is made surer. Further, when the adhesive force is 100 g/25 mm or less, the tape can be peeled more easily after the completion of etching without damaging the adherend, and no glue will remain at the circumferential part of the adherend.

In the present invention, to facilitate the release of the adhesive tape after etching treatment, the adhesive tape may be irradiated with radiation additionally after the completion of the etching treatment and before the peeling step, thereby curing completely the radiation-curable adhesive layer.

The surface-protecting method of the present invention exhibits excellent effects that, by sticking a radiation-curable adhesive tape on an adherend wafer and etching the wafer after curing with radiation, glue can be prevented from remaining at the circumferential part of the wafer, the adhesive force of the radiation-curable adhesive tape can be prevented from changing due to heat generated during etching, and failure of peeling of the tape or glue remaining on the patterned surface can be prevented.

Next, the present invention will be described in detail in accordance with examples, but the invention is not limited to these examples.

EXAMPLE 1

To 100 parts by weight of an acrylic adhesive (a copolymer of 2-ethylhexyl acrylate with n-butyl acrylate), were added 3 parts by weight of a polyisocyanate compound (available under the trade name of Colonate L, manufactured by Nippon Polyurethane Co., Ltd.), 150 parts by weight of an isocyanurate compound having 5 functional groups, and 1 part by weight of α-hydroxycyclohexyl phenyl ketone as a photopolymerization initiator, followed by mixing, thereby preparing a radiation-curable adhesive. The radiation-curable adhesive was coated onto the surface of a 100 μm-thick film support made of a high-density polyethylene resin, which support had been subjected to a corona treatment, such that the thickness of the radiation-curable adhesive after drying would be 20 μm, thereby preparing a radiation-curable adhesive tape.

The radiation-curable adhesive tape was cut into a strip 25 mm wide, the strip was stuck onto an adherend of a stainless steel plate abraded with water resistant abrasive paper No. 280, and the adhesive force was measured based on JIS Z0237 after and before irradiation with ultraviolet rays (90° peel; peel rate: 50 mm/min; ultraviolet irradiation conditions: an 80-w/cm high pressure mercury vapor lamp, irradiation time 10 sec, integrated amount of light 1,000 mJ/cm$^2$; measurements in the Examples and Comparative Examples given below were made in the same way).

This radiation-curable adhesive tape was stuck onto a silicon wafer, i.e., an adherend, of diameter 5 inches having circuit patterns, and after letting it stand for about 1 hour, it was irradiated with ultraviolet rays to cure completely the radiation-curable adhesive layer. The conditions of irradiation with ultraviolet rays were the same as described above. Then the wafer was dipped for 5 min in an etching liquid of a mixture of nitric acid (concentration: 61%) and hydrofluoric acid (concentration: 46%) (mixing volume ratio: 10:1), to etch the wafer. The state of the tape during the etching was observed and separation, loosening, denaturation, etc., of the adhesive tape were evaluated.

Then, the adhesive tape was peeled from the wafer and the circumferential part of the wafer and remaining glue on the patterns were observed under a microscope.

The results are shown in Tables 1 and 2.

EXAMPLE 2

Example 1 was repeated, except that 100 parts by weight of an acrylic adhesive (a copolymer of 2-ethylhexyl acrylate with n-butyl acrylate), 3 parts by weight of a polyisocyanate compound (trade name of Colonate L, manufactured by Nippon Polyurethane Co., Ltd.), 80 parts by weight of an isocyanurate compound having 6 functional groups, 20 parts by weight of a urethane acrylate compound having two functional groups, and 1 part by weight of α-hydroxycyclohexyl phenyl ketone as a photopolymerization initiator were mixed, thereby preparing a radiation-curable adhesive to produce a radiation-curable adhesive tape.

The adhesive force of this radiation-curable adhesive tape was measured in the same way as in Example 1, then the surface of a circuit-patterned silicon wafer was protected using the radiation-curable adhesive tape, and after the radiation-curable adhesive tape was irradiated with ultraviolet rays in the same way as in Example 1, the wafer was etched, and the tape was peeled.

The results of the observation made in the course and the evaluation are shown in Tables 1 and 2.

EXAMPLE 3

Example 1 was repeated, except that 100 parts by weight of an acrylic adhesive (a copolymer of 2-ethylhexyl acrylate with n-butyl acrylate), 3 parts by weight of a polyisocyanate (trade name of Colonate L, manufactured by Nippon Polyurethane Co., Ltd.), 150 parts by weight of an isocyanurate compound having 6 functional groups, and 1 part by weight of α-hydroxycyclohexyl phenyl ketone as a photopolymerization initiator were mixed, thereby preparing a radiation-curable adhesive to produce a radiation-curable adhesive tape.

Then, with respect to the obtained adhesive tape, the same measurements as in Example 1 were carried out. The surface of the part of a circuit-patterned silicon wafer was protected using the adhesive tape in the same way as in Example 1, and the adhesive tape was irradiated with ultraviolet rays to semi-cure the adhesive layer. The conditions of irradiation with ultraviolet rays were: an 80-w/cm high pressure mercury vapor lamp, irradiation time 2 sec, integrated amount of light was 200 mJ/cm$^2$. Thereafter the wafer was etched. After the etching, the adhesive tape was further irradiated with ultraviolet rays, to cure the adhesive layer to lower the adhesive force further, and then the adhesive tape was peeled from the silicon wafer.

The results of the observation made in the course and the evaluation are shown in Tables 1 and 2.

COMPARATIVE EXAMPLE 1

Example 1 was repeated, except that 100 parts by weight of an acrylic adhesive (a copolymer of 2-ethylhexyl acrylate with n-butyl acrylate), 3 parts by weight of a polyisocyanate (trade name of Colonate L, manufactured by Nippon Polyurethane Co., Ltd.), 100 parts by weight of dipentaerythritol hexaacrylate, and 1 part by weight of α-hydroxycyclohexyl phenyl ketone as a photopolymerization initiator were mixed, thereby preparing a radiation-curable adhesive to produce a radiation-curable adhesive tape.

Next, the adhesive force of this radiation-curable adhesive tape was measured in the same way as in Example 1. The surface of a circuit-patterned silicon wafer was protected by using this adhesive tape in the same way as in Example 1, then the adhesive tape was irradiated with ultraviolet rays, the wafer was etched, and the tape was peeled.

The results of the observation made in the course and the evaluation are shown in Tables 1 and 2.

COMPARATIVE EXAMPLE 2

The radiation-curable adhesive tape produced in Example 1 was stuck onto a silicon wafer, i.e., an adherend, of diameter 5 inches and having circuit patterns, and after letting it stand for about 1 hour and before irradiation with ultraviolet rays, the silicon wafer was etched. After the etching, the adhesive tape was irradiated with ultraviolet rays and the radiation-curable adhesive tape was peeled from the adherend wafer. In this case also, the adhesive of the adhesive tape used was tested in the same way as in Example 1 and the state of the protection of the surface was observed.

The results are shown in Tables 1 and 2.

TABLE 1

| (adhesive force of the adhesive tape used (g/25 mm) | | | | |
|---|---|---|---|---|
| | Before curing | After complete curing | Immediately before etching | At release of the tape |
| Example 1 | 640 | 35 | 35 | 35 |
| Example 2 | 850 | 52 | 52 | 52 |
| Example 3 | 1150 | 10 | 70 | 10 |
| Comparative example 1 | 580 | 5 | 5 | * |

TABLE 1-continued

| | (adhesive force of the adhesive tape used (g/25 mm)) | | | |
|---|---|---|---|---|
| | Before curing | After complete curing | Immediately before etching | At release of the tape |
| Comparative example 2 | 640 | 35 | 640 | 35 |

Note:
* the tape came off during the etching.

TABLE 2

| | (The state during and after the etching) | | | |
|---|---|---|---|---|
| | Separation of the tape during the etching | Remaining glue at the circumferential part of the wafer | Remaining glue at the patterned surface | The state of curing of the adhesive at the time of etching |
| Example 1 | not observed | not observed | not observed | completely cured |
| Example 2 | not observed | not observed | not observed | completely cured |
| Example 3 | not observed | not observed | not observed | semi-cured |
| Comparative example 1 | observed | — | — | completely cured |
| Comparative example 2 | not observed | observed | observed | not cured |

As is apparent from the results in Table 2, according to the present invention, glue remaining on the patterned surface and glue remaining on the circumferential area of the wafer can be prevented, and the separation of adhesive tape during etching does not occur.

Having described our invention as related to the present embodiments, it is our intention that the invention not be limited by any of the details of the description, unless otherwise specified, but rather be construed broadly within its spirit and scope as set out in the accompanying claims.

What we claim is:

1. A surface-protection method when a plate material is chemically etched, which comprises sticking a radiation-curable pressure sensitive adhesive tape onto the area of chemically etchable plate material where etching should not be effected, and after the radiation-curable adhesive layer is cured with irradiation of light or ionizing radiation, subjecting said plate material and adhesive to a chemical etching treatment, wherein said radiation step reduces the adhesive force to such an extent that it is not brought below 20 g/25 mm.

2. The surface-protection method as claimed in claim 1, wherein the adhesive force of the radiation-curable adhesive tape after irradiation of light or ionizing radiation is in the range of 20 to 200 g/25 mm.

3. The surface-protection method as claimed in claim 1, wherein the etching treatment is conducted using a chemical etching liquid containing at least one compound selected from the group consisting of hydrogen fluoride, hydrogen chloride, sulfuric acid, nitric acid, acetic acid, hydrogen peroxide, and phosphoric acid.

4. The surface-protection method as claimed in claim 1, wherein the adhesive layer of the radiation-curable adhesive tape comprises a composition containing 100 parts by weight of an acrylic adhesive and 5 to 200 parts by weight of a compound that has a carbon-carbon double bond.

5. The surface-protection method as claimed in claim 1, wherein said adhesive tape comprises a film support made of material that is resistant to etching and capable of transmitting radiation, which is selected from the group consisting of polyethylene, isotactic polypropylene, ethylene tetrafluoride, FEP, PFA, and polyethylene terephthalate.

6. The surface-protection method as claimed in claim 1, wherein the radiation-curable adhesive tape is cured with irradiation of ultraviolet rays.

7. The surface-protection method as claimed in claim 1, wherein said adhesive tape comprises a film support made of a material which is selected from the group consisting of a high-density polyethylene, an isotactic polypropylene, and a polyethylene terephthalate.

8. The surface-protection method as claimed in claim 1, wherein the radiation-curable adhesive layer has a thickness of 10 to 50 μm.

9. The surface-protection method as claim in claim 1, wherein the adhesive force of the radiation-curable adhesive tape after irradiation of light or ionizing radiation is in the range of 20 to 100 g/25 mm.

* * * * *